United States Patent [19]
Chwu

[11] Patent Number: 5,473,569
[45] Date of Patent: Dec. 5, 1995

[54] METHOD FOR OPERATING A FLASH MEMORY

[75] Inventor: Hsinya Chwu, Mesa, Ariz.

[73] Assignee: Motorola, Inc., Schaumburg, Ill.

[21] Appl. No.: 283,431

[22] Filed: Aug. 1, 1994

[51] Int. Cl.$^6$ .................................................. G11C 7/00
[52] U.S. Cl. ................ 365/218; 365/185.11; 365/185.29
[58] Field of Search ...................................... 365/185, 218, 365/900, 230.03

[56] References Cited

U.S. PATENT DOCUMENTS

| | | | |
|---|---|---|---|
| 5,341,330 | 8/1994 | Wells et al. | 365/185 |
| 5,341,339 | 8/1994 | Wells | 365/218 |
| 5,369,616 | 11/1994 | Wells et al. | 365/218 |
| 5,388,083 | 2/1995 | Assar et al. | 365/218 |

*Primary Examiner*—Joseph A. Popek
*Attorney, Agent, or Firm*—Gary W. Hoshizaki

[57] ABSTRACT

A method for operating a Flash memory having a plurality of memory blocks. In a first method, data is written to a memory block having less than the predetermined threshold of memory remaining. Any remaining data is written to a memory block having the largest amount of memory remaining. In a second method, data is written to a memory block having a least amount of memory remaining when an average of the memory used in each block falls below the predetermined threshold. Any remaining data is also written to a memory block having the largest amount of memory remaining. A block erase is performed on a memory block by first copying any data to be saved to a copy block of the Flash memory. Each memory block has an identifying code. An identifying code of the copy block is changed to an identifying code of the memory block. A block erase is then performed on the memory block and the identifying code of the memory block is changed to the identifying code of the copy block.

14 Claims, 3 Drawing Sheets

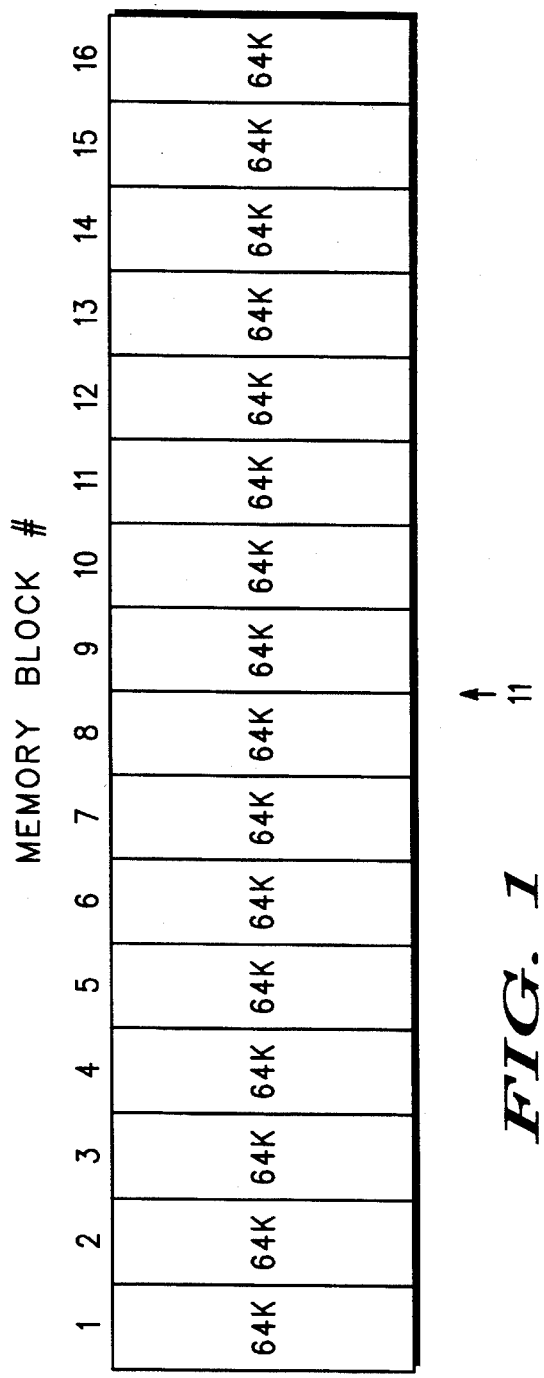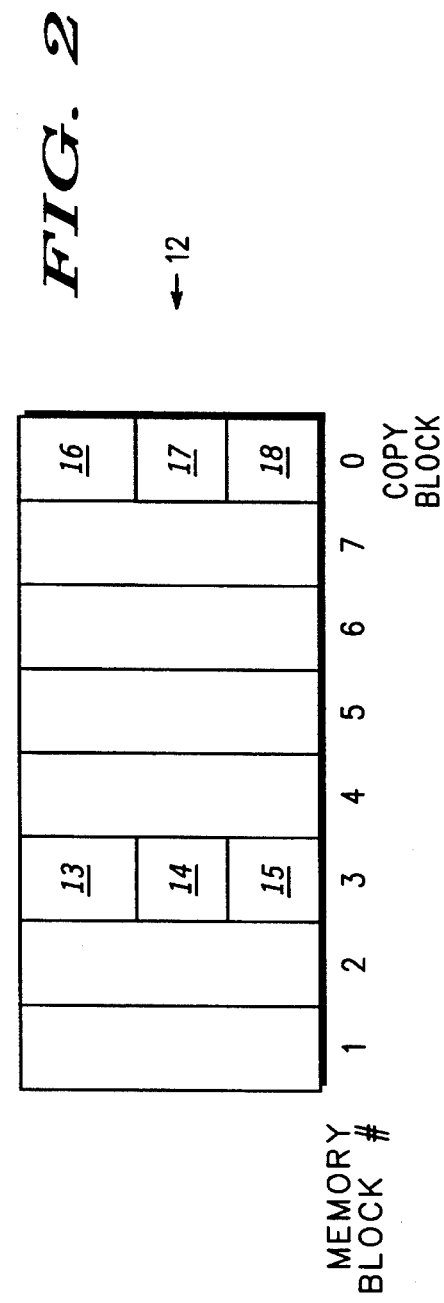

|   |   | 22 |   |   |   | 23 |
|---|---|----|---|---|---|----|
|   |   |    |   |   |   | 24 |
| 1 | 2 | 3  | 4 | 5 | 6 | 7 | 0 |

COPY BLOCK

*FIG. 3* ↑ 21

|   |   |   |   |   |   |   | 23 |
|---|---|---|---|---|---|---|----|
|   |   |   |   |   |   |   | 24 |
| 1 | 2 | 0 | 4 | 5 | 6 | 7 | 3  |

COPY BLOCK ↑ 21

*FIG. 4*

Figure 5 shows shaded blocks labeled 32, 33, 34, 35, 36 with columns 1-7, 0 and COPY BLOCK at position 0.

*FIG. 5* ↑ 31

METHOD FOR OPERATING A FLASH MEMORY

BACKGROUND OF THE INVENTION

This invention relates, in general, to Flash Memory, and more particularly, to minimizing block erases of a Flash Memory.

In general, a Flash Memory is a non-volatile memory that does not require power such as a battery backup to retain its memory contents. A Flash Memory has several traits that differentiate it from other memory types. Three operations are commonly performed on a Flash Memory, a read operation, a write operation, and a block erase operation.

A read operation of a Flash Memory is performed at speeds similar to that of SRAMs (Static Random Access Memories). For example, Flash Memories currently being marketed have read access times of approximately 100 nanoseconds which is comparable to that of many SRAMs.

A write operation is performed by changing bits from a preset first logic level to a second logic level. For example, each byte of a Flash Memory is preset with logic one levels prior to a write operation. A write operation is performed by changing the logic one levels of predetermined bits of a selected byte to logic zero levels. A bit that has been changed from a logic one level to a logic zero level cannot be changed back to the logic one level by a write operation. A write operation of a Flash Memory is performed in approximately 10 microseconds which is significantly slower than a corresponding read operation.

FIG. 1 is an illustration of a Flash Memory 11 divided into blocks. In this example, Flash Memory 11 has 16 blocks, each block has 64 kilobytes of memory resulting in a total memory size of 1 megabyte. Each memory block is individually accessed without affecting the contents of the other memory blocks. A block erase operation on Flash Memory 11 writes a first logic level (for example a logic one level) to each bit of a memory block. Once a write operation is performed on a byte, a block erase (erasing all data in the block) is performed to rewrite new data to the same byte. A limit exists for the number of times a block erase operation is performed on a memory block before its integrity is compromised. A typical limit for block erases is approximately 100,000 times per block. Furthermore, a block erase operation takes a significant amount of time (approximately 1 second) so it is important to manage how the data is stored on each block to reduce the number of block erases required.

It would be of great benefit if a method for operating a Flash Memory could be provided that reduces the number of block erases required, more efficiently stores data without overlapping to other memory blocks, and on average decreases time required for block erases.

BRIEF DESCRIPTION OF THE DRAWINGS

FIG. 1 is an illustration of a Flash memory divided into blocks;

FIG. 2 is an illustration of a Flash memory having a copy block in accordance with the present invention;

FIG. 3 is an illustration of a Flash memory having an identifying code for each memory block in accordance with the present invention;

FIG. 4 is an illustration of the Flash memory of FIG. 3 showing memory block identifying codes being changed after a write sequence;

FIG. 5 is an illustration of a Flash Memory having data written therein showing an order for writing data to the Flash memory in accordance with the present invention;

DETAILED DESCRIPTION OF THE DRAWINGS

Figure 6:
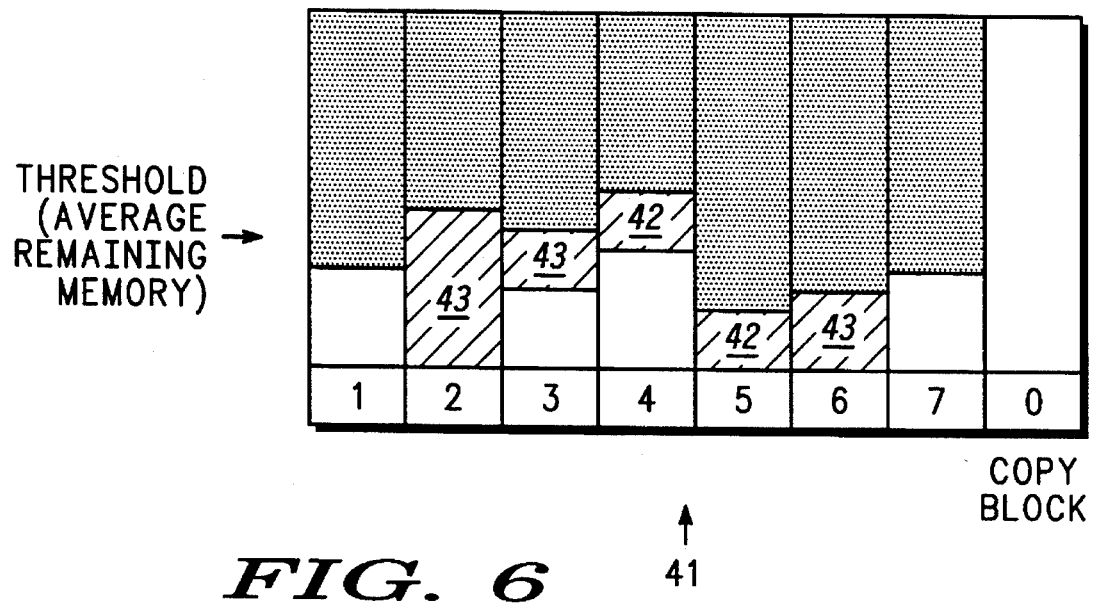
FIG. 6 is an illustration of a Flash Memory having data written therein showing an order for storing data when an average remaining memory falls below a predetermined threshold.

It is well known that Flash memory is suited for memory applications that require non-volatility. Furthermore, Flash memory has sufficient storage capability for storing large amounts of data. Flash memory has unique properties that governs its use in different types of applications. For example, writing to a flash memory takes significantly longer than other types of semiconductor memory such as a static RAM (SRAM). Typical write times for a word is approximately 10 microseconds for a Flash memory. Once data is written in memory it must be erased or reinitialized before new data is written to the memory location.

A block architecture divides a Flash memory into a predetermined number of memory blocks that can be individually accessed. Prior to writing to a memory block, A memory block is initialized (block erase) to a common logic level prior to writing to the memory block. For example, a logic zero level is written to each bit of a memory block during a block erase or initialization. Writing a word in a memory block changes bits of the word from the initialized logic zero level to logic one levels. Rewriting over a word that has already been written too requires a block erase be performed to set each bit of the memory block to the common logic level. Thus, rewriting over a single word in a block of a Flash memory is extremely inefficient and time consuming. If a Flash memory is not divided into blocks, the entire memory would have to be reinitialized taking even more time. A block erase takes a significant amount of time, typically on the order of one second for a 1 megabyte Flash memory divided into sixteen 64 kilobyte blocks as shown in FIG. 1. It should be noted that the number of block erases is limited to approximately 100,000 times per memory block to insure reliable data storage. How block erases are performed on a Flash memory plays an extremely important role in their longevity.

Reading data from a Flash memory is similar to other forms of memory. The word location within a memory block is accessed and the bit levels of the word are sensed. Access times for reading a word in Flash memory is on the order of 100 nanoseconds.

A method for operating a Flash memory is best described by example. The method is applicable to most Flash memory applications and the example is only for illustration purposes. FIG. 2 is an illustration of a Flash memory 12 that is divided into eight memory blocks (numbered 0–7). Only seven of the memory blocks are used to store data, an eighth memory block is used as a copy block. Memory block 0 is the copy block although any block in Flash memory 12 can be used as the copy block.

Data is stored in memory block 3 of Flash memory 12. In this example, the data stored in memory block 3 are phone messages. A phone message is random in length and easily stored within a memory block of Flash memory 12. A first phone message is stored in a memory area 13, a second phone message is stored in a memory 14, and a third phone message is stored in a memory area 15. A block erase of memory block 3 is required if a new message is written over a previously written phone message. Area in a memory block becomes available after listening to the message and discarding it. A problem occurs with other messages stored in a memory block. For example, a block erase of memory block 3 would need to be performed if the second message in memory area 14 of memory block 3 is to be discarded and written over. This poses a problem if either the first or third messages need to be saved or haven't been listened to yet.

The number of block erases are kept to a minimum by writing to the copy block (memory block 0). The first and third phone messages in memory areas 13 and 15 of memory block 3 are respectfully written to memory areas 16 and 18 of memory block 0 (the copy block). In the preferred embodiment, memory locations 16 and 18 of memory block 0 (the copy block) correspond to the memory locations in memory block 3 where the first and third phone message are stored. A new message is written into memory area 17 of memory block 0 (the copy block). Other messages can be written to memory area 17 of memory block 0 if memory remains in memory area 17 after the new message is written. If the new message uses more memory than available in memory area 17 the remainder of the new message is stored in another memory block.

A block erase is performed on memory block 3 erasing the phone messages stored in memory areas 13, 14, and 15. In the preferred embodiment, memory block 3 now becomes the copy block. Thus a single block erase is used to store a new message while retaining other data of a memory block. Rotating the copy block amongst the memory blocks of Flash memory 12 also randomly distributes a block erase thereby averaging the number of block erases to each memory block.

FIG. 3 is an illustration of a Flash memory 21 having eight memory blocks. An identifying code is stored in a word of memory of each block. The identifying code identifies each memory block. In the example, shown in FIG. 3 the memory blocks are identified by a number 0 thru 7 which is stored in the last word of each memory block. Memory block 0 (storing identifying code 0) is a copy block. Hereinafter, each memory block is identified by the identifying code it stores. In the preferred embodiment, a block erase sets all bits in a memory block to a logic zero level.

Storing an identifying code in each memory block allows each memory block to be easily identified. Memory block 0 is identified as the copy block. A write sequence similar to the example described in FIG. 2 is performed. Data is to be written to an area of memory block 3 other than a memory area 22. The data in memory area 22 is to be saved. Memory block 3 has data written throughout and cannot be written to without a block erase. Instead of writing to memory block 3 data is written to the copy block. Data stored in memory area 22 of memory block 3 is saved by writing the data into a corresponding memory area 23 of memory block 0 (the copy block). New data is written to a memory area 24 of the copy block. Any memory remaining in memory area 24 can be written to at a later time. Any remaining data is written to another memory block if memory area 24 is used up by the write sequence.

FIG. 4 is an illustration of Flash memory 21 of FIG. 3 showing further steps of the write sequence. After the data is written to the copy block its identifying code is changed from 0 to 3, thus it is no longer the copy block. The write sequence changes the identify code of the copy block to the identifying code of the memory block (memory block 3) that was initially identified for a write operation. A block erase is performed on memory block 3 of FIG. 3 setting all bits to a logic zero level including changing the identifying code to 0. Thus the previous memory block 3 of FIG. 3 is now identified as the copy block. The use of the identifying code is used to trace the data to its new memory block location. Operating Flash memory 21 as shown in FIGS. 3 and 4 minimizes the number of block erases when trying to rewrite over a previously written area of a memory block. It also randomly distributes the block erases of each memory block thereby maximizing the number of block erases performed on Flash memory 21.

FIG. 5 is an illustration of a Flash memory 31 having data stored in the shaded portion of Flash memory 31. All remaining portions of Flash memory 31 do not require a block erase when further data is added. Each memory block has an identifying code numbered from 0–7, memory block 0 is the copy block. Note that each memory block has a significant portion of its total memory remaining.

The order in which data is stored in Flash memory 31 is by memory available in each block. For example, data is written to a memory area 32 of a memory block 5 first, since it has the most memory remaining. Next, data is written to a memory area 33 of a memory block 7 since it now has the most memory available of all memory blocks. Further data added to Flash memory 31 would follow an order of a memory area 34 of a memory block 2, a memory area 35 of a memory block 4, and a memory area 36 of memory block 5. Data is stored to a memory block having the most memory remaining to minimize the number of blocks used to store data.

FIG. 6 is an illustration of a Flash memory 41 showing an order for storing data in each memory block when an average memory remaining in Flash memory 41 falls below a predetermined threshold. All remaining portions of Flash memory 41 do not require a block erase when further data is added. Each memory block has an identifying code numbered from 0–7, memory block 0 is the copy block. Note that each memory block does not have a significant amount of memory remaining. In this example, the predetermined threshold for changing how data is stored in Flash memory 41 occurs when approximately ⅓ of the memory remains as indicated in FIG. 6.

Data is first stored in a memory block having the least amount of memory left, if the data exceeds the area of the memory block it is then placed in each memory block having the most memory remaining. For example, a memory block 5 has the least amount of memory remaining, data is placed in a memory area 42 of memory block 5 and then in a memory area 42 of a memory block 4 after filling memory block 5 up. Next, data is placed in a memory area 43 of a memory block 6 having the least amount of memory remaining in Flash memory 41. After filling memory block 6 up, data is placed in a memory area 43 of memory block 2 (the memory block having the most memory available). Upon filling memory block 2 up, the remaining data is placed in a memory area 43 of memory block 3 (the memory block having the most memory available). Further data would be added to memory block 3 next since it now has the least amount of memory remaining.

Writing data to a memory block with the least data remaining (filling up the memory block) and then writing to memory blocks having the most data remaining reduces the average number of memory blocks required to store data as Flash memory 41 fills up. The time required to erase data could be substantial if it is placed in several memory blocks. The predetermined threshold at which this write sequence is used is a function of the average length of data placed in a memory block during a write operation.

Figure 7:
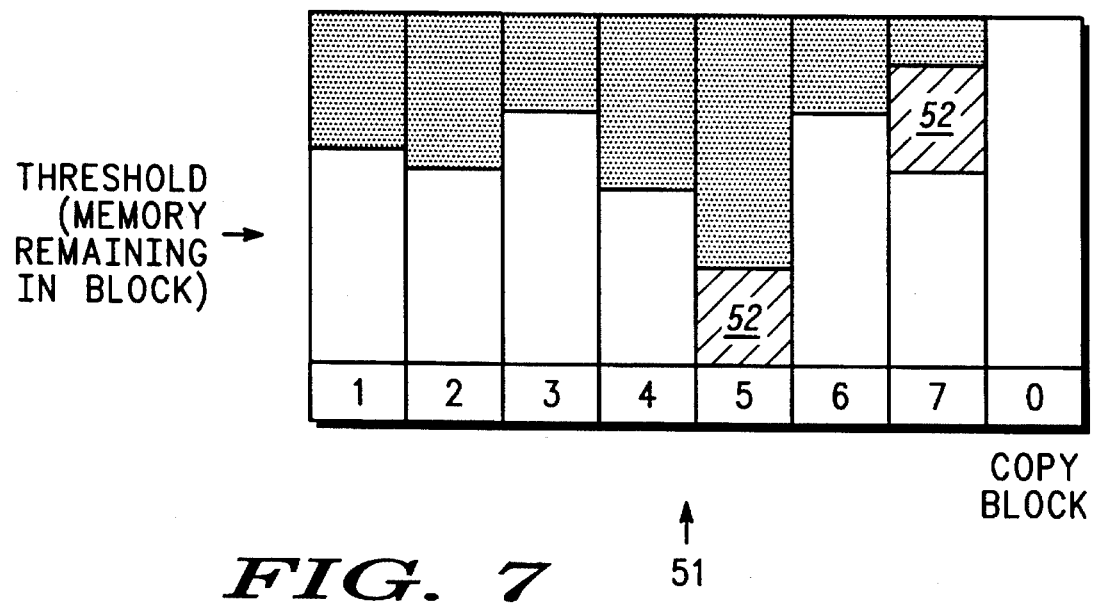
FIG. 7 is an illustration of a Flash Memory having data written therein showing an order for storing data when remaining memory of a memory block falls below a predetermined threshold.

FIG. 7 is an illustration of a Flash memory 51 showing an order for storing data in each memory block when data remaining a memory block in Flash memory 51 falls below a predetermined threshold. All remaining portions of Flash memory 51 do not require a block erase when further data is added. Each memory block has an identifying code numbered from 0–7, memory block 0 is the copy block. Note that each memory block has a random amount of memory remaining. In this example, the predetermined threshold for changing how data is stored in Flash memory 41 occurs when approximately ⅓ of the memory remains as indicated in FIG. 7.

Data is first stored in a memory block having less than the predetermined threshold of memory remaining. Data is then added to memory blocks having the most memory remaining if the memory block (having less than the predetermined threshold of memory remaining) fills up. In this example, a memory block 5 has less than the predetermined threshold of memory remaining. Data is written to a memory area 52 of memory block 5. Any remaining data is then placed in a memory area 52 of a memory block 7 since it has the most memory available.

Writing data first to any memory block having less than the predetermined threshold of memory remaining and then writing to memory blocks having the most data remaining after it fills up reduces the average number of memory blocks required to store data as Flash memory 51 is filled up with data.

By now it should be appreciated that a method for operating a Flash memory has been provided. The Flash memory is divided into memory blocks, each memory block can be individually accessed. Data is written into a memory block having the largest amount of memory remaining if each memory block has more than a predetermined threshold of memory remaining. This maximizes the probability the data will fit in a single memory block.

Data is written into a memory block if it falls below the predetermined threshold of memory remaining. Any remaining data is written to a memory block having the largest amount of memory remaining. This minimizes the average number of memory blocks required to store data.

An alternate method is to write data to a memory block having the least amount of memory remaining when an average memory remaining in the Flash memory falls below the predetermined threshold. Any remaining data is written to a memory block having the largest amount of memory remaining thereby minimizing the average number of memory blocks required to store data.

In a Flash memory it is not possible to write over previously entered data. A block erase is performed on an entire memory block to remove data and put the memory block in condition for writing new data to it. This process not only takes a significant amount of time but it erases all data in the memory block, some of which may need to be saved. Also, the number of block erases that can be performed on a Flash memory is limited to a finite number. Thus it is important to minimize the number of block erases performed on a Flash memory. Block erases are minimized by first identifying each memory block with an identifying code. In the preferred embodiment, the identifying code is stored in each memory block. One memory block is identified as a copy block. Data that needs to be saved is written to the copy block from a memory block to be block erased. New data can also be written to the copy block at this time. Once data is transferred the identifying code of the memory block to be block erased is written to the copy block. The memory block is block erased and the identifying code of the copy block is written to the memory block thereby making it the new copy block. This process randomly distributes the block erases among all the memory blocks (maximizing memory life) and minimizes the number of block erases required for a write sequence.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A method for operating a Flash memory, the Flash memory having a plurality of memory blocks, the method comprising:

identifying each memory block of the Flash memory with an identifying code wherein one memory block is a copy block;

selecting a memory block for a block erase;

copying portions of said memory block to be saved to said copy block;

changing an identifying code of said copy block to an identifying code of said memory block; and changing said identifying code of said memory block to said identifying code of said copy block.

2. A method for operating a Flash memory as recited in claim 1 further including a step of performing a block erase on said memory block prior to changing said identifying code of said memory block to said identifying code of said copy block.

3. A method for operating a Flash memory as recited in claim 1 wherein said step of identifying each memory block of the Flash memory with an identifying code includes a step of storing each identifying code in each memory block.

4. A method for operating a Flash memory as recited in claim 3 wherein said step of changing an identifying code of said copy block to an identifying code of said memory block includes a step of writing said identifying of said memory block into said copy block.

5. A method for operating a Flash memory as recited in claim 3 wherein said step of changing identifying code of said memory block to said identifying code of said copy block includes a step of writing said identifying code of said copy block in said memory block.

6. A method for operating a Flash memory as recited in claim 1 further including a step of writing new data into said copy block.

7. A method for operating a Flash memory, the Flash memory having a plurality of memory blocks, the Flash memory having each memory bit initialized to a same logic level, the method comprising a step of writing data to a memory block having a largest amount of memory remaining when each memory block has more than a predetermined threshold of memory remaining.

8. A method for operating a Flash memory as recited in claim 7 further including the steps of:

identifying when a memory block of the plurality of memory blocks has less than said predetermined threshold of memory remaining;

writing data to said memory block having less than said predetermined threshold of memory remaining; and writing any remaining data to a memory block of the plurality of memory blocks having a largest amount of memory remaining.

9. A method for operating a Flash memory as recited in claim 7 further including the steps of:

identifying when an average memory remaining of the plurality of memory blocks is less than said predetermined threshold;

writing data to a memory block of the plurality of memory blocks having a least amount of memory remaining; and writing any remaining data to a memory block of the plurality of memory blocks having a largest amount of memory remaining.

10. A method for operating a Flash memory as recited in claim 7 further including the steps of:

storing an identifying code in each memory block of the Flash memory; and identifying a memory block of the plurality of memory blocks as a copy block.

11. A method for operating a Flash memory as recited in claim 10 further including the steps of:

identifying a memory block of the plurality of memory blocks having data to be erased.

copying data to be saved from said memory block having data to be erased to said copy block; and writing an identifying code of said memory block having data to be erased in said copy block.

12. A method for operating a Flash memory as recited in claim 11 further including a step of performing a block erase on said memory block having data to be erased.

13. A method for operating a Flash memory as recited in claim 12 further including a step of writing new data onto said copy block.

14. A method for operating a Flash memory as recited in claim 13 further including a step of writing an identifying code of said copy block in said memory block having data to be erased.

* * * * *